United States Patent
Wong

(10) Patent No.: US 7,292,064 B2
(45) Date of Patent: Nov. 6, 2007

(54) MINIMIZING TIMING SKEW AMONG CHIP LEVEL OUTPUTS FOR REGISTERED OUTPUT SIGNALS

(75) Inventor: Tak Kwong (Dino) Wong, Milpitas, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 29 days.

(21) Appl. No.: 11/278,370

(22) Filed: Mar. 31, 2006

(65) Prior Publication Data

US 2007/0236249 A1    Oct. 11, 2007

(51) Int. Cl.
*H03K 19/173* (2006.01)
*H03K 19/00* (2006.01)
*H03K 19/096* (2006.01)
*G06F 7/38* (2006.01)

(52) U.S. Cl. .......................... 326/38; 326/37; 326/39; 326/40; 326/93; 326/95; 326/98; 326/112; 326/119; 326/121; 716/8; 327/208; 327/224; 327/225

(58) Field of Classification Search ............ 326/37–41, 326/47, 93, 95, 98, 112, 119, 121, 31, 34, 326/36, 26, 27, 83, 86; 327/208–212, 214, 327/215, 224, 225
See application file for complete search history.

(56) References Cited

U.S. PATENT DOCUMENTS

| | | | |
|---|---|---|---|
| 5,594,367 A * | 1/1997 | Trimberger et al. | 326/41 |
| 5,811,985 A * | 9/1998 | Trimberger et al. | 326/38 |
| 6,867,615 B1 * | 3/2005 | Plants et al. | 326/40 |
| 7,218,155 B1 * | 5/2007 | Chang et al. | 327/108 |
| 7,221,193 B1 * | 5/2007 | Wang et al. | 327/108 |

* cited by examiner

*Primary Examiner*—Rexford Barnie
*Assistant Examiner*—Dylan White
(74) *Attorney, Agent, or Firm*—Bever, Hoffman & Harms, LLP

(57) ABSTRACT

A synchronous output buffer circuit which effectively moves combinational logic associated with an output enable operation, boundary scan operation, and voltage translation to a pipe that leads into a pair of output registers that operate in response to the output clock signal. The output registers may be forced to asynchronously route an input signal to an output terminal during a reset mode and during a boundary scan mode. The output registers can include a safety circuit, which prevents pull-up and pull-down devices (which drive the output signal), from turning on at the same time.

27 Claims, 4 Drawing Sheets

MINIMIZING TIMING SKEW AMONG CHIP LEVEL OUTPUTS FOR REGISTERED OUTPUT SIGNALS

FIELD OF THE INVENTION

The present invention relates to an improved method and structure for minimizing the timing skew of registered output signals of an integrated circuit chip.

BACKGROUND OF THE INVENTION

FIG. 1 is a block diagram of a typical synchronous output buffer circuit 100, which includes boundary scan features that support IEEE standard 1149.1. Synchronous output buffer circuit 100 includes output registers 101-102, multiplexers 111-112, tri-state output buffer 120, logical AND gate 115 and inverter 116, which are connected as illustrated.

Signals used to implement the boundary scan features of synchronous output buffer circuit 100 include a boundary scan data signal (BS_D), a boundary scan output enable signal (BS_OE) and a boundary scan tri-state signal (BS_Tri). These boundary scan signals are well known to those of ordinary skill in the art. A mode control signal (MODE) is activated to enable a boundary scan mode (and de-activated to enable a normal operating mode). In the boundary scan mode, the activated MODE signal causes multiplexers 111 and 112 to route the boundary scan data signal BS_D and the boundary scan output enable signal BS_OE, respectively. The boundary scan data signal BS_D is applied to the data input terminal of tri-state output buffer 120. The boundary scan output enable signal BS_OE is applied to an input terminal of AND gate 115. The other input terminal of AND gate 115 is coupled to receive the inverse of the boundary scan tri-state signal BS_Tri from inverter 116. The output of AND gate 115 provides an output enable signal OEo to a control terminal of tri-state output buffer 120.

When the boundary scan tri-state signal BS_Tri is activated to a logic '1' state, AND gate 115 provides an output enable signal OEo having a logic '0' state. In response, tri-state output buffer 120 enters a high impedance state (to implement the HIGHZ boundary scan instruction).

When the boundary scan tri-state signal ES_Tri is de-activated to a logic '0' state, AND gate 115 provides an output enable signal OEo having the same logic state as the boundary scan output enable signal BS_OE. If the boundary scan output enable signal BS_OE (and therefore the output enable signal OEo) has a logic '1' state, then tri-state output buffer 120 drives received boundary scan data signal BS_D as the output data signal Q. The output data signal Q is driven off of the integrated circuit chip on which synchronous output buffer circuit 100 is located.

During normal operation of synchronous output buffer circuit 100, the MODE signal and the boundary scan tri-state signal BS_Tri are both de-activated to a logic '0' state. Output registers 101 and 102 are coupled to receive a data signal Di and an output enable signal OEi, respectively, from the internal logic of the integrated circuit chip. Output registers 101 and 102 synchronously latch the applied signals Di and OEi, respectively, in response to rising edges of an output clock signal CLK. Output registers 101 and 102 provide the latched signals to multiplexers 111 and 112, respectively. The de-activated MODE signal causes multiplexer 111 to route the signal provided by output register 101 as the data signal Do. This data signal Do is provided to the input terminal of tri-state output buffer 120. The de-activated MODE signal also causes multiplexer 112 to route the signal latched in output register 102 to AND gate 115. The logic '0' state of the boundary scan tri-state signal BS_Tri causes AND gate 115 to route the signal provided by multiplexer 112 as the output enable signal OEo. The output enable signal OEo is provided to the control terminal of tri-state output buffer 120. If the output enable signal OEo has a logic '1' state, then tri-state output buffer 120 is enabled to drive the received data signal Do as the output signal Q.

In a double data rate (DDR) output interface, the output clock signal CLK switches at two times (2×) the frequency of the system clock signal (i.e., the clock signal that controls the internal logic of the integrated circuit chip). In addition, the synchronous output buffer circuit 100 and the internal logic of the integrated circuit chip are coupled to different power supplies. The power supply coupled to the synchronous output buffer circuit 100 typically exhibits a relatively wide voltage supply range (e.g., 1.4 to 1.9 Volts), while the power supply coupled to the internal logic is designed to exhibit a relative narrow voltage supply range (e.g., 1.7 to 1.9 Volts). Finally, the separate power supplies require that a voltage translation circuit (not shown) be included within the synchronous output buffer circuit 100.

To maximize performance at a system level, the skew among the output signals ('output skew') of a chip needs to be minimized. The system clock cycle time is increased by the amount of output skew. In the case of a DDR output, the system clock cycle time is increased by 2× the amount of output skew. Hence, controlling the output skew to a minimum is very important for high speed design.

Some issues relating to output skew have been resolved by prior art output buffer circuits. For example, the output skew has been reduced by using a balanced clock tree to route the output clock signal CLK, in combination with a delay locked loop (DLL) circuit to synchronize the output clock signal CLK with an input clock signal. In addition, output impedance matching circuits have been used to compensate for variations in output buffer strength, which occur with variations in data polarity, voltage and temperature.

However, some issues relating to output skew have not been resolved. For example, the delay from the rising edge of the output clock signal CLK to the time that the output data Q is provided (hereinafter referred to as the 'CLK-to-Q delay') involves 5 different paths within synchronous output buffer circuit 100. These different CLK-to-Q delays are introduced when: (1) the data signal Do causes the output signal Q to transition to a logic '1' state, (2) the data signal Do causes the output signal Q to transition to a logic '0' state, (3) the output enable signal OEo causes the output signal Q to transition to a logic '1' state, (4) the output enable signal OEo causes the output signal Q to transition to a logic '0' state, and (5) the output enable signal OEi causes the output signal Q to transition to a high impedance state (i.e., tri-state). Each of these five paths actually includes two sub-paths, wherein one of these sub-paths controls a pull-up device within output buffer 120, and the other sub-path controls a pull-down device within output buffer 120. With so many paths interweaving together, it is very hard to optimize the design such that all paths have the same delay to achieve minimal skew. The skew will be further magnified by process, voltage and temperature variation.

In addition, if synchronous output buffer circuit 100 operates from a different power supply than the associated internal logic, the voltage translation circuit within the output buffer circuit 100 introduces more delay skew over all of the possible voltage combinations of the internal logic power supply and the output buffer power supply. It is difficult to design the voltage translation circuit such that the delays introduced by logic '1' to logic '0' transitions are the same as the delays introduced by logic '0' to logic '1' transitions.

It would therefore be desirable to have an improved synchronous output buffer circuit, which overcomes the above-described deficiencies of the prior art, thereby minimizing the skew between output signals.

SUMMARY

Accordingly, the present invention provides a synchronous output buffer circuit which effectively moves combinational logic associated with an output enable operation, boundary scan operation, and voltage translation to a pipe that leads into a pair of output registers that operate in response to the output clock signal.

The present invention will be more fully understood in view of the following description and drawings.

DETAILED DESCRIPTION

Figure 2:
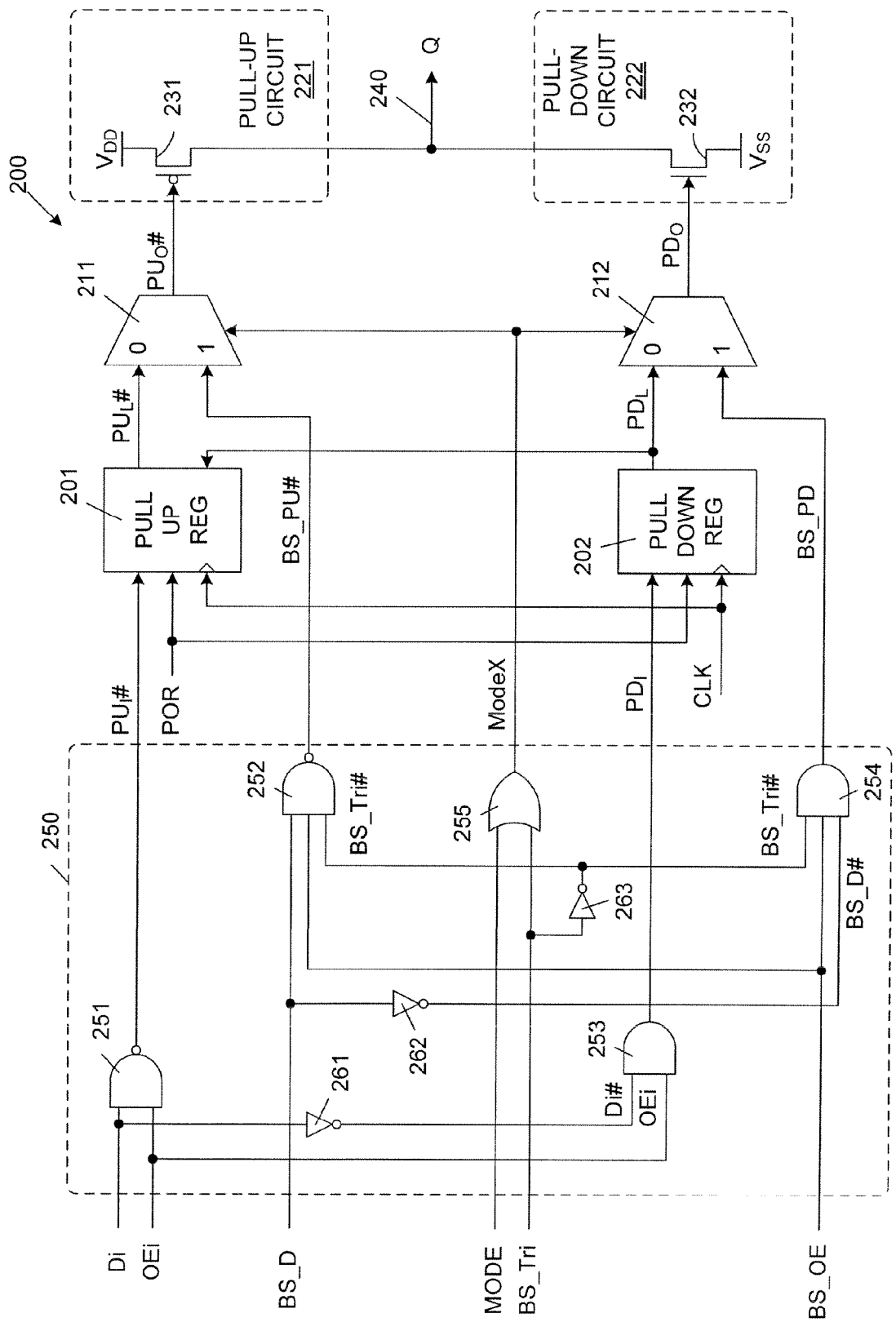
FIG. 2 is a block diagram of a synchronous output buffer circuit in accordance with one embodiment of the present invention.

FIG. 2 is a block diagram of a synchronous output buffer circuit 200 in accordance with one embodiment of the present invention. Synchronous output buffer circuit 200 includes pull-up register 201, pull-down register 202, multiplexers 211-212, pull-up circuit 221, pull-down circuit 222, output terminal 240 and pre-register combinational input logic 250.

In the described embodiment, pull-up circuit 221 includes a p-channel (PMOS) transistor 231, which has a source coupled to receive a positive output supply voltage $V_{DD}$ and a drain coupled to output terminal 240. The gate of p-channel transistor 231 is coupled to receive a pull-up output signal $PU_o\#$ from multiplexer 211. Also in the described embodiment, pull-down circuit 222 includes an n-channel (NMOS) transistor 232, which has a source coupled to receive a ground supply voltage $V_{ss}$ and a drain coupled to output terminal 240. The gate of n-channel transistor 232 is coupled to receive a pull-down output signal $PD_o$ from multiplexer 212.

In response to a mode select signal ModeX, multiplexer 211 selects the pull-up output signal $PU_o\#$ from a latched pull-up input signal $PU_L\#$ and a boundary scan pull-up signal BS_PU#. Pull-up output register 201 provides the latched pull-up input signal $PU_L\#$ in response to a pull-up input signal $PU_I\#$ and an output clock signal CLK. In accordance with one embodiment, pull-up register 201 is a D-Q flip-flop, which operates in response to rising edges of the output clock signal CLK.

Multiplexer 212 also operates in response to the mode select signal ModeX, selecting the pull-down output signal $PD_o$ from a latched pull-down input signal $PD_L$ and a boundary scan pull-down signal BS_PD. Pull-down output register 202 provides the latched pull down input signal $PD_L$ in response to a pull-down input signal $PD_I$ and the output clock signal CLK. In accordance with one embodiment, pull-down output register 202 is a D-Q flip-flop, which operates in response to rising edges of the output clock signal CLK.

Figure 1:
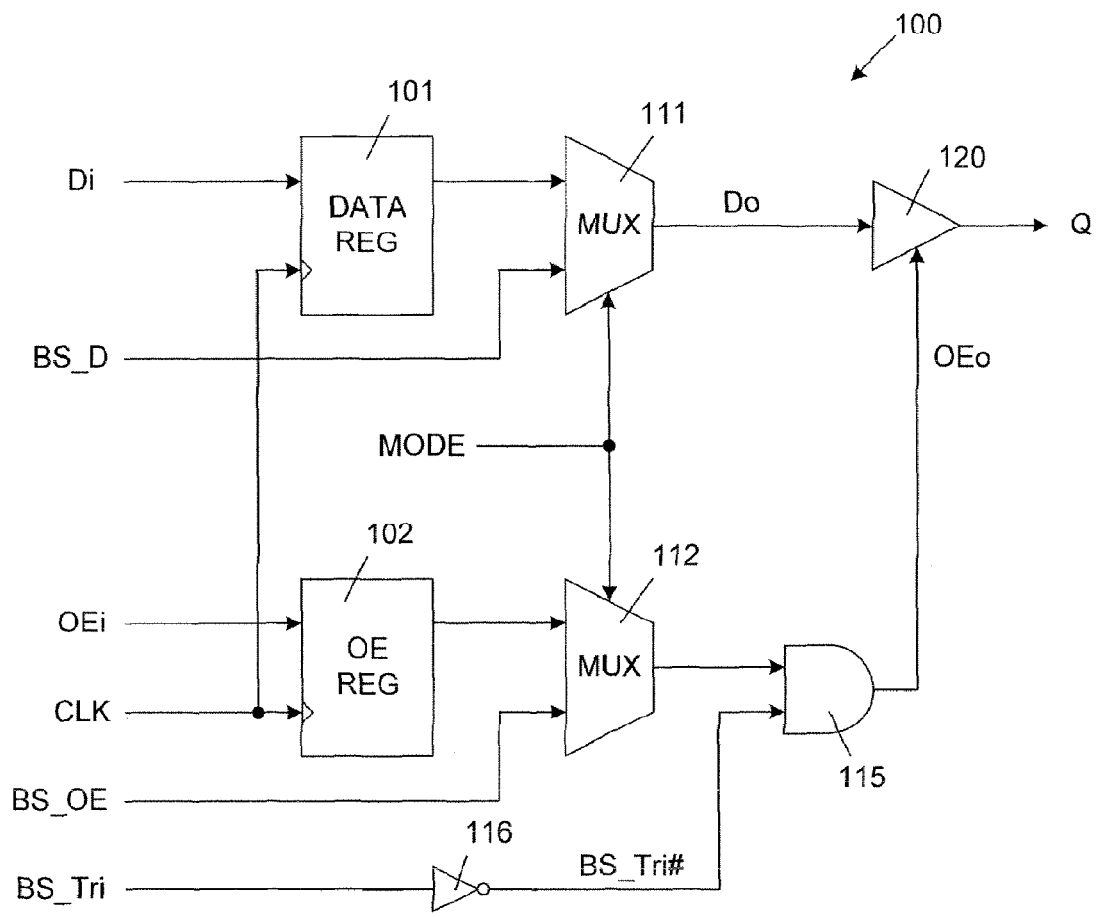
FIG. 1 is a block diagram of a conventional synchronous output buffer circuit.

As described in more detail below, mode select signal ModeX, pull-up input signal $PU_I\#$, pull-down input signal $PD_I$, boundary scan pull up signal BS_PU# and boundary scan pull-down signal BS_PD are generated by combinational logic circuit 250. In the described embodiment, combinational logic circuit 250 generates these signals in response to the mode signal MODE, the data input signal Di, the output enable signal OEi, the boundary scan data signal BS_D, the boundary scan output enable signal BS_OE and the boundary scan tri-state signal BS_Tri. These conventional signals (MODE, Di, OEi, BS_D, BS_OE and BS_Tri) have been described above in connection with the operation of the synchronous output buffer circuit 100 of FIG. 1.

A key concept utilized by synchronous output buffer circuit 200 is to move as much logic as possible to the pipe that leads into pull-up output register 201 and pull-down output register 202 (i.e., to the left of pull-up register 201 and pull-down register 202 in FIG. 2). As used herein, a 'pipe' is defined as the combinational logic elements located between sequential (clocked) logic elements. Combinational logic circuit 250 represents the movement of logic to the pipe that leads into output registers 201-202, in accordance with one embodiment of the present invention. For example, with respect to the synchronous output buffer circuit 100 of FIG. 1, combinational logic circuit 250 represents the movement of multiplexer 112, AND gate 115, inverter 116, and certain functions of tri-state output buffer 120 to the pipe that leads into output registers 201-202. Combinational logic circuit 250 thereby effectively minimizes the CLK-to-Q delay path, such that the absolute skew of the CLK-to-Q delay is also minimized.

For typical high speed design, the output clock signal CLK is synchronized with respect to an input clock signal using a conventional delay locked loop (DLL) circuit. As a result, the output clock signal CLK is automatically adjusted (delayed) as logic is moved to the pipe that leads into output registers 201-202. Hence, the setup time of the pull-up and pull-down input signals $PU_I\#$ and $PD_I$ provided to output registers 201 and 202 stays relatively the same (with respect to the output buffer circuit 100 of FIG. 1). In other words, the performance of output buffer circuit 200 in terms of maximum frequency is not adversely affected by combinational logic circuit 250.

Combinational logic circuit 250 will now be described in more detail. Combinational logic circuit 250 includes logical NAND gates 251-252, logical AND gates 253-254, logical OR gate 255, and inverters 261-263.

NAND gate 251 provides the pull-up input signal $PU_I\#$ in response to the input data signal Di and the output enable input signal OEi. Thus, the pull-up input signal $PU_I\#$ is activated to a logic '0' state if the output enable input signal OEi and the input data signal Di are activated to logic '1' states otherwise, the pull-up input signal $PU_I\#$ is de-activated to a logic '1' state. Note that in the present specification, active low signals and complementary signals are designated with the symbol, #

Inverter 261 provides inverted input data signal Di# in response to the input data signal Di. AND gate 253 provides the pull-down input signal $PD_I$ in response to the inverted input data signal Di# and the output enable input signal OEi. Thus, pull-down input signal $PD_I$ is activated to a logic '1' state if the output enable input signal OEi is activated to a logic '1' state and the input data signal Di is de-activated to a logic '0' state. Otherwise, the pull-down input signal $PD_I$ is de-activated to a logic '0' state. OR gate 255 provides the ModeX signal in response to the MODE signal and the BS_Tri signal. Thus, the ModeX signal has a logic '1' state if the MODE signal is activated to a logic '1' state (i.e., the boundary scan mode is enabled) or the BS_Tri signal is activated to a logic '1' state (i.e., output driver circuit 200 is to be placed in a high impedance state, or tri-stated). When the ModeX signal has a logic '1' state, multiplexers 211 and 212 pass the boundary scan pull up signal BS_PU# and the boundary scan pull-down signal BS_PD, respectively.

If neither the MODE signal nor the BS_Tri signal is activated, the ModeX signal has a logic '0' state. The logic '0' state of the ModeX signal enables the normal operating mode. Under these conditions, multiplexers 211 and 212 pass the latched pull-up signal $PU_L$# and the latched pull-down signal $PD_L$, respectively.

Inverter 263 provides inverted boundary scan tri-state signal BS_Tri# in response to the boundary scan tri-state signal BS_Tri. NAND gate 252 provides the boundary scan pull up signal BS_PU# in response to the boundary scan data signal BS_D, the boundary scan output enable signal BS_OE, and the inverted boundary scan tri-state signal BS_Tri#. Thus, the boundary scan pull-up signal BS_Pu# is activated to a logic '0' state when the boundary scan data signal BS_D is activated to a logic '1' state, the boundary scan output enable signal BS_OE is activated to a logic '1' state, and the boundary scan tri-state signal BS_Tri is de-activated to a logic '0' state. Otherwise, NAND gate 252 de-activates the boundary scan pull-up signal BS_PU# To a logic '1' state.

Inverter 262 provides inverted boundary scan data signal BS_D# in response to the boundary scan data signal BS_D. AND gate 254 provides the boundary scan pull-down signal BS_PD in response to the inverted boundary scan tri-state signal BS_Tri#, the inverted boundary scan data signal BS_D# and the boundary scan output enable signal BS_OE. Thus, the boundary scan pull-down signal BS_PD is only activated to a logic '1' state when the boundary scan data signal BS_D has a logic '0' state, the boundary scan output enable signal BS_OE is activated to a logic '1' state, and the boundary scan tri-state signal BS_Tri is de-activated to a logic '0' state. Otherwise, the boundary scan pull-down signal BS_PD is de-activated to a logic '0' state.

The operation of synchronous output buffer circuit 200 will now be described in more detail.

The boundary scan mode is activated by activating the MODE signal to a logic '1' state. The activated MODE signal causes OR gate 255 to provide a ModeX signal having a logic '1' state. In response, multiplexers 211 and 212 to route the boundary scan pull-up signal BS_PU# and the boundary scan pull-down signal BS_PD as the pull-up output signal $PU_o$# and the pull-down output signal $PD_o$, respectively.

If boundary scan tri-state signal BS_Tri is de-activated to a logic '0' state while the boundary scan mode is enabled (i.e., MODE='1'), then NAND gate 252 and AND gate 254 provide the boundary scan pull-up signal BS_PU# and the boundary scan pull-down signal BS_PD, respectively, in response to the boundary scan data signal BS_D and the boundary scan output enable signal BS_OE. That is, inverter 263 provides a BS_Tri# signal having a logic '1' state in response to the logic '0' state of the BS_Tri signal. The logic '1' state of the BS_Tri# signal effectively enables NAND gate 252 to implement a two-input NAND function in response to the boundary scan data signal BS_D and the boundary scan output enable BS_OE signal. Similarly, the logic '1' state of the BS_Tri# signal effectively enables AND gate 254 to implement a two-input AND function in response to the inverted boundary scan data signal BS_D# and the boundary scan output enable signal BS_OE.

If the boundary scan output enable signal BS_OE is de-activated to a logic '0' state, then NAND gate 252 de-activates the boundary scan pull-up signal BS_PU# to a logic '1' output value, and AND gate 254 deactivates the boundary scan pull-down signal BS_PD to a logic '0' output value. In this case, the pull-up output signal $PU_o$# and the pull-down output signal $PD_o$ have logic '1' and logic '0' states respectively. The logic '1' state of the pull-up output signal $PU_o$# turns off PMOS transistor 231 within pull-up circuit 221. Similarly, the logic '0' state of the pull-down output signal $PD_o$ turns off NMOS transistor 232 within pull-down circuit 222. Thus, the de-activated BS_OE signal causes output terminal 240 to be placed in a high impedance (floating) state.

However, if the boundary scan output enable signal BS_OE is activated to a logic '1' state, then NAND gate 252 and AND gate 254 each provides an output signal equal to the inverse of the BS_D signal. Thus, if the boundary scan data signal BS_D has a logic '1' state, then the BS_PU# and BS_PD signals will both have logic '0' states. The logic '0' state of the BS_PU# signal causes PMOS transistor 231 to turn on, and the logic '0' state of the BS_PD signal causes NMOS transistor 232 to turn off, such that the output terminal 240 is coupled to the positive supply voltage $V_{DD}$ (i.e., a logic '1' state).

Conversely, if the boundary scan data signal BS_D has a logic '0' state, then the BS_PU# and BS_PD signals will both have a logic '1' state. The logic '1' state of the BS_PU# signal causes PMOS transistor 231 to turn off, and the logic '1' state of the BS_PD signal causes NMOS transistor 232 to turn on, such that the output terminal 240 is coupled to the ground supply voltage $V_{ss}$ (i.e., a logic '0' state). In this manner, the boundary scan data signal BS_D may be propagated to output terminal 240 of output buffer circuit 200 during the boundary scan mode.

If the boundary scan tri-state signal BS_Tri is activated to a logic '1' state, then inverter 263 will provide an inverted boundary scan tri-state signal BS_Tri# having a logic '0' state. In response to the logic '0' BS_Tri# signal, NAND gate 252 provides a boundary scan pull-up signal BS_PU# having a logic '1' state, and AND gate 154 provides a boundary scan pull-down signal BS_PB having a logic '0' state. In this case, the pull-up output signal $PU_o$# and the pull-down output signal $PD_o$ have logic '1' and logic '0' states respectively. The logic '1' state of the pull-up output signal $PU_o$# turns off PMOS transistor 231 in pull-up circuit 221. Similarly, the logic '0' state of the pull-down output signal $PD_o$ turns off NMOS transistor 232 in pull-down circuit 222. Thus, the activated BS_Tri signal causes output terminal 240 to be placed in a high impedance state. Note that activating the BS_Tri signal to a logic '1' state will cause the output buffer circuit 200 to enter a high impedance state, even if the MODE signal is not activated to a logic '1' state (i.e., during normal operating mode).

The normal operating mode is activated by de-activating the MODE signal and the BS_Tri signal to logic '0' states. The de-activated MODE and BS_Tri signals cause OR gate 255 to provide a ModeX signal having a logic '0' state. In response, multiplexers 211 and 212 route the latched pull-up input signal $PU_L\#$ and the latched pull-down input signal $PD_L$ as the pull-up output signal $PU_o\#$ and the pull-down output signal $PD_o$, respectively.

As described above, the latched pull-up input signal $PU_L\#$ and the latched pull-down signal $PD_L$ are provided by latching the pull-up input signal $PU_I\#$ and the pull-down input signal $PD_I$ into registers 201 and 202, respectively, in response to the output clock signal CLK. If the output enable signal OEi is de-activated to a logic '0' state, then NAND gate 251 de-activates the pull-up input signal $PU_I\#$ to a logic '1' value, and AND gate 254 de-activates the pull-down input signal $PD_I$ to a logic '0' output value. The de-activated pull-up and pull-down input signals $PU_I\#$ and $PD_I$ are latched into registers 201 and 202 in response to a rising edge of the output clock signal. In this case, the pull-up output signal $PU_o\#$ and the pull-down output signal $PD_o$ have logic '1' and logic '0' states respectively. The logic '1' state of the pull-up output signal $PU_o\#$ turns off PMOS transistor 231 within pull-up circuit 221. Similarly, the logic '0' state of the pull-down output signal $PD_o$ turns off NMOS transistor 232 within pull-down circuit 222. Thus, the de-activated output enable signal OEi signal causes output terminal 240 to be placed in a high impedance (floating) state.

However, if the output enable signal OEi is activated to a logic '1' state, then NAND gate 251 and AND gate 253 each provides an output signal equal to the inverse of the input data signal Di. Thus, if the input data signal Di has a logic '1' state, then the $PU_I\#$ and $PD_I$ signals will both have logic '0' states. The logic '0' state of the $PU_I\#$ signal is latched into pull-up register 201, and causes PMOS transistor 231 to turn on. The logic '0' state of the $PD_I$ signal is latched into pull-down register 202, and causes NMOS transistor 232 to turn off. As a result, the output terminal 240 is coupled to the positive supply voltage $V_{DD}$ (i.e., a logic '1' state).

Conversely, if the input data signal Di has a logic '0' state, then the $PU_I\#$ and $PD_I$ signals will both have a logic '1' state. The logic '1' state of the $PU_I\#$ signal is latched into pull-up register 201, and causes PMOS transistor 231 to turn off. The logic '1' state of the $PD_I$ signal is latched into pull-down register 202, and causes NMOS transistor 232 to turn on. As a result, the output terminal 240 is coupled to the ground supply voltage $V_{ss}$ (i.e., a logic '0' state). In this manner, the input data signal Di may be propagated to output terminal 240 of output buffer circuit 200 during the normal operating mode.

Several observations can be made concerning the operation of output buffer circuit 200. First, the boundary scan tri-state signal BS_Tri is effectively removed from the critical speed path in output buffer circuit 200 by forcing the ModeX signal to a logic '1' state whenever the BS_Tri signal is activated to a logic '1' state. This operation is logically valid because the latched pull-up and pull-down data values $PU_L\#$ and $PD_L$ provided by registers 201 and 202 are 'don't care' values whenever the output data value Q is forced to a tri-state condition by the logic '1' state of the BS_Tri signal.

Also, during normal operating mode, the ModeX signal has a logic '0' state, such that pull-up and pull-down registers 201-202 drive pull-up and pull-down circuits 221-222 of output buffer circuit 200 through multiplexers 211 and 212. The short and non-overlapping nature of these timing paths (i.e., CLK-to-$PU_o\#$-to-Q and CLK-to-$PD_o$-to-Q) simplifies the matching of the CLK-to-Q delay under various conditions. Moreover, the number of driver stages from output registers 201-202 to output terminal 240 is the same for the pull-up output signal $PU_o\#$ and the pull-down output signal $PD_o$. In the synchronous output buffer circuit 100 of FIG. 1, the delay between the output enable signal $OE_o$ and the output signal Q ($OE_o$-to-Q delay) is difficult to balance because the number of driver stages required to pull up the output signal Q in response to a rising edge of the output enable signal $OE_o$ is different from the number of driver stages required to pull down output signal Q in response to a rising edge of the output enable signal $OE_o$. This problem is further complicated by the fact that the $OE_o$-to-Q delay must be the same whether the data signal $D_o$ is static or toggling.

To achieve the minimum CLK-to-Q skew, the output registers 201 and 202 are made as identical as possible. Similarly, multiplexers 211 and 212 are made as identical as possible. Finally, pull-up circuit 221 and pull-down circuit 222 are made as identical as possible. In accordance with one embodiment, only the sizes of pull-up transistor 231 and pull-down transistor 232 are different, to account for the different driving strengths of PMOS transistors and NMOS transistors.

Different types of output registers require different initial output states (e.g., output states at reset). For example, certain clock outputs should be driving a DC value at reset, while conventional data outputs should typically be held in a high impedance state (i.e., tri-stated) at reset, thereby preventing fighting between different parts tied together at the system level. Because the desired initial output state is different for different types of output registers, pull-up register 201 and pull-down register 202 both require asynchronous set and reset functions. However, the set and reset logic within a register is typically located in the CLK-to-Q path, which will increase the output skew. In accordance with one embodiment of the present invention, the set and reset logic is implemented as follows.

Figure 2A:
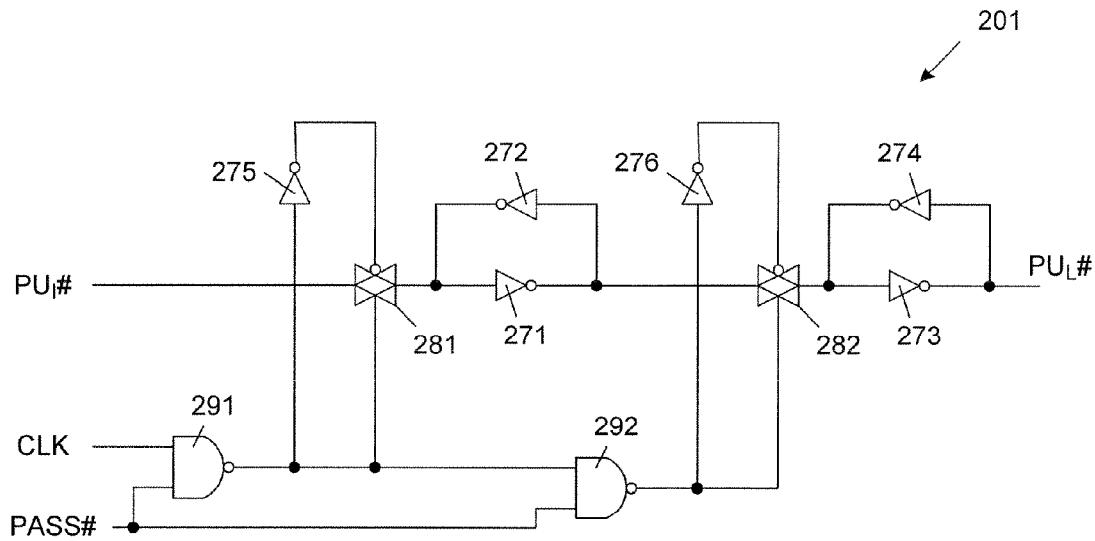
FIGS. 2A and 2B are circuit diagrams illustrating a pull-up register in accordance with various embodiments of the present invention.

FIG. 2A is a circuit diagram of pull-up register 201 in accordance with one embodiment of the present invention. Pull-down register 202 can be implemented in the same manner as pull-up register 201. Pull-up register 201 includes inverters 271-276, pass gate circuits 281-282 and NAND gates 291-292, which are connected as illustrated. Pull-up register 201 is forced into a pass-through mode (such that output $PU_L\#$ is equal to input $PU_I\#$) when the set or reset function is needed. The pass-through function is enabled when the PASSE applied to NAND gates 291-292 is activated to a logic '0' state, thereby turning on both pass gate circuits 281 and 281. The desired value (not shown) to be forced into pull-up register 201 is coupled to the data input path of register 201.

The set and reset logic forces the latches in pull-up register 201 and pull-down register 202 to asynchronously store the applied pull-up and pull-down input values $PU_I\#$ and $PD_I$, respectively, during reset. This logic enables registers 201-202 to achieve an equivalent asynchronous set/reset function. Again, extra delay can be introduced to the output clock signal CLK, without adversely effecting the operation of output buffer circuit 200, because of the self-adjusting nature of the delay locked loop used to adjust the output clock signal CLK. The output clock signal CLK can be freely changed without affecting the skew, because only the rising edges of the output clock signal CLK affect the output timing.

During power-up, the latched pull-up signal $PU_L\#$ provided by register 201 has a chance of being in an active logic '0' state, while the latched pull-down signal $PD_L$ provided by register 202 has a chance of being in an active logic '1' state. This condition can cause a short circuit current to flow between pull-up circuit 221 and pull-down circuit 222, which is definitely not desirable. Although an internal power-up reset circuit can be used, it is difficult to guarantee that the power-up reset circuit will work for all possible power ramp-up waveforms and conditions. Accordingly, a safety circuit is implemented within output buffer circuit 200 in accordance with another embodiment of the present invention. In this embodiment, the latched pull-down signal $PD_L$ provided by pull-down register 202 is coupled to the feedback path of the latch circuitry within pull-up register 201.

Figure 2B:
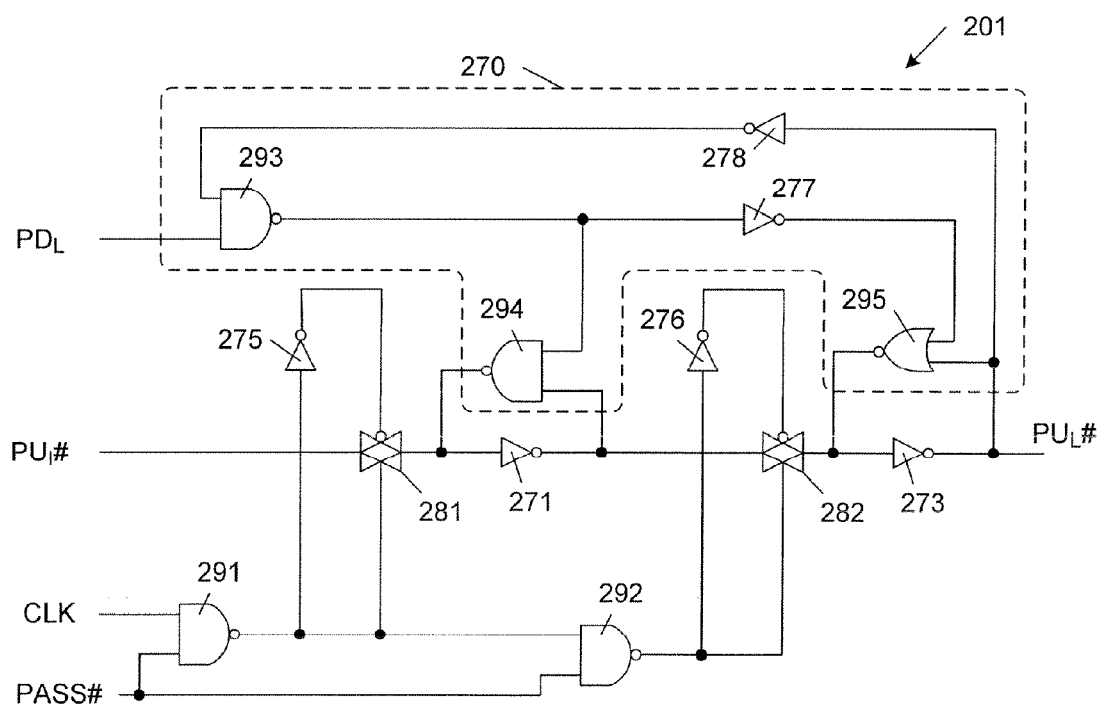

FIG. 2B illustrates a safety circuit 270 located in the feedback path of the pull-up register 201 of FIG. 2A. Similar elements in FIGS. 2A and 2B are labeled with similar reference numbers. Safety circuit 270 includes inverters 277-278, NAND gates 293-294 and NOR gate 279, which are connected as illustrated. When the latched pull-down signal $PD_L$ provided by pull-down register 202 is activated (high) and the latched pull-up signal $PU_L\#$ provided by pull-up register 201 is also activated (low), NAND gate 293 provides a logic '0' output signal, thereby forcing the latched pull-up signal $PU_L\#$ to be de-activated to a logic '1' value (via NAND gate 294, inverter 277 and NOR gate 295. When NAND gate 293 provides a logic '1' output signal, NAND gate 294 and NOR gate 295 operate in the same manner as inverters 272 and 274, respectively (FIG. 2A). Note that the PASS# signal has priority over safety circuit 270.

The output of pull-up register 201 is designed to have a stronger drive than the output of pull-down register 202, because pull-up register 201 must drive p-channel device 231, which is larger than n-channel device 232. Whenever the latched pull-down signal $PD_L$ is activated to a logic '1' state, the latched pull-up signal $PU_L\#$ of pull-up register 201 is deactivated to a logic '1' state through the feedback path of the latch circuit within pull-up register 201. Because the latched pull-up signal $PU_L\#$ is modified via the feedback path of register 201, rather than the critical path of register 201, the effect on output skew is negligible. Moreover, this safety circuit 270 will also prevent pull-up circuit 221 and pull-down circuit 222 from being turned on together during normal operating conditions, other than power-up reset.

This feature may be useful when the setup times of the pull-up input signal $PU_I\#$ and the pull-down input signal $PD_I$ are marginal, such that one of these signals has transitioned to an active state prior to the rising edge of the clock signal CLK, while the other signal does not transition to an inactive state until after the rising edge of the clock signal CLK.

The synchronous output buffer circuit 200 of FIG. 2 only illustrates one possibility of moving logic to the left of the output registers 201 and 202. In this embodiment, the output enable logic is moved into combinational logic circuit 250. However, logic can be moved to the left of output registers 201 and 202 in different manners in accordance with other embodiments of the present invention.

Figure 3:
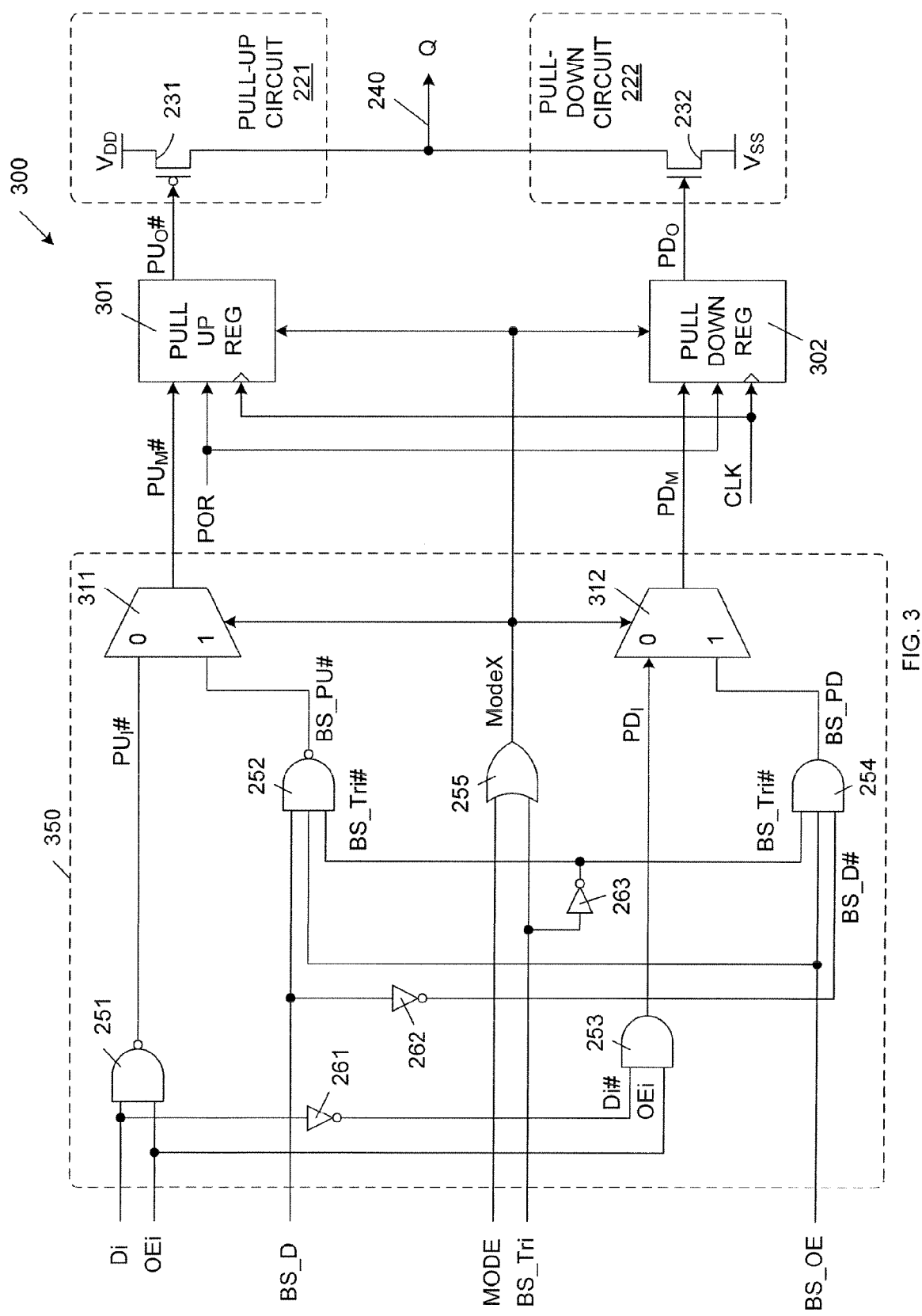
FIG. 3 is a block diagram of a synchronous output buffer circuit in accordance with an alternate embodiment of the present invention.

FIG. 3 is a block diagram of an output buffer circuit 300 in accordance with another embodiment of the present invention. Because similar elements are used in output buffer circuits 200 and 300, similar elements in FIGS. 2 and 3 are labeled with similar reference numbers. Thus, output buffer circuit 300 includes NAND gates 251-252, AND gates 253-254, OR gate 255 and inverters 261-263, which are connected in the manner described above. In output buffer circuit 300, multiplexers 311 and 312 are included in combinational logic circuit 350, and multiplexers 211-212 are eliminated. Viewed another way, multiplexers 311 and 312 represent moving multiplexers 211-212 to the input pipe of output registers 201-202.

Multiplexer 311 is coupled to receive the pull-up input signal $PU_I\#$ provided by NAND gate 251 and the boundary scan pull-up signal BS_PU# provided by NAND gate 252. Multiplexer 312 is coupled to receive the pull-down input signal $PD_I$ provided by AND gate 253 and the boundary scan pull-down signal BS_PD provided by AND gate 254. Multiplexers 311 and 312 are controlled by the ModeX signal provided by OR gate 255.

Pull-up register 301 is coupled to receive the pull-up signal $PU_M\#$ routed by multiplexer 311, and pull-down register is coupled to receive the pull-down signal $PD_M$ routed by multiplexer 312. These signals $PU_M\#$ and $PD_M$ are stored in registers 301 and 302, respectively, in response to the rising edge of the output clock signal CLK. Registers 301 and 302 provide these stored signals as the pull-up output signal $PU_o\#$ and the pull-down output signal $PD_o$, respectively.

To achieve logic equivalence of output buffer circuits 200 and 300, the latches inside output registers 301 and 302 are forced to asynchronously route the $PU_M\#$ and $PD_M$ signals, respectively, provided by multiplexers 311 and 312 whenever the ModeX signal has a logic '1' state. The only logic mismatch between output buffer circuits 200 and 300 is that the pull-up and pull-down signals stored in output registers 301 and 302 are destroyed whenever the ModeX signal has a logic '1' state. However, this limitation should be acceptable for most systems using boundary scan.

In accordance with another aspect of the present invention, a voltage translation stage of output buffer circuit can be moved to the left of the output registers 201-202 (or 301-302). This advantageously eliminates delay dependency that may be associated with data polarity. The only drawback is that when the output power supply voltage is lower than the core power supply voltage, and the CLK-to-Q delay is increased due to the lower output power supply voltage. However, this will only be a concern if the absolute timing requirements cannot be met (i.e., if the setup time for the pull-up input signal $PU_I\#$ or the pull-down input signal $PD_I$ is already close to zero, such that any speed up of output clock signal CLK by the delay locked loop to compensate for the slower CLK-to-Q path results in a setup time violation).

Although the present invention has been described in connection with various embodiments, it is understood that variations of these embodiments would be obvious to one of ordinary skill in the art. Thus, the present invention is limited only by the following claims.

I claim:

1. A synchronous output buffer circuit comprising:
   a first output register configured to latch a first input signal in response to an output clock signal, and thereby provide a first output signal;
   a second output register configured to latch a second input signal in response to the output clock signal, and thereby provide a second output signal;
   an output driver directly connected to receive the first and second output signals from the first and second output registers, and in response drive an output signal on an output terminal of the synchronous output buffer;
   combinational logic configured to provide the first and second input signals in response to a first set of signals used to implement a first output function and a second set of signals used to implement a second output function, different than the first output function, wherein the combinational logic is located entirely within one or more pipes that lead into the first and second output registers.

2. The synchronous output buffer of claim 1, wherein the output driver includes a first output circuit configured to selectively couple or de-couple a first voltage supply with the output terminal in response to the first output signal, and a second output circuit configured to selectively couple or de-couple a second voltage supply with the output terminal in response to the second output signal.

3. The synchronous output buffer circuit of claim 2, wherein the first output circuit comprises a pull-up transistor controlled by the first output signal, and coupled between the output terminal and the first voltage supply, and wherein the second output circuit comprises a pull-down transistor controlled by the second output signal, and coupled between the output terminal and the second voltage supply.

4. The synchronous output buffer of claim 1, wherein the first output function comprises a data output enable function.

5. The synchronous output buffer of claim 4, wherein the second output function comprises a boundary scan output function.

6. The synchronous output buffer of claim 5, wherein the combinational logic comprises:
a first multiplexer configured route a pull-up input signal or a boundary scan pull-up signal as the first input signal in response to a mode signal;
a second multiplexer configured to route a pull-down input signal or a boundary scan pull-down signal as the second input signal in response to the mode signal.

7. The synchronous output buffer circuit of claim 6, wherein the combinational logic includes logic configured to generate the mode signal in response to a first control signal that identifies a boundary scan mode and a normal operating mode, and a second control signal that identifies a tri-state condition in the boundary scan mode.

8. The synchronous output buffer circuit of claim 1, wherein the combinational logic includes one or more logic gates configured to generate the first and second input signals in response to a data signal and an output enable signal.

9. The synchronous output buffer circuit of claim 1, wherein the combinational logic includes one or more logic gates configured to generate the first and second input signals in response to a boundary scan data signal, a boundary scan output enable signal, and a boundary scan tri-state control signal.

10. The synchronous output buffer circuit of claim 1, wherein the output terminal is directly connected to an output connector of an integrated circuit chip.

11. The synchronous output buffer circuit of claim 1, wherein the first output register is substantially identical to the second output register.

12. The synchronous output buffer circuit of claim 1, further comprising a connection that provides the second output signal from the second output register to a feedback path within the first output register, thereby preventing the output driver from simultaneously driving the output terminal to two different states.

13. The synchronous output buffer of claim 1, wherein the first and second output registers each comprise pass-through circuitry which, when enabled, allows the first and second input signals to be routed through the first and second output registers asynchronously.

14. The synchronous output buffer of claim 1, wherein the combinational logic includes a voltage translation circuit for translating one or more core voltages to one or more output voltages.

15. A synchronous output buffer circuit comprising:
a first output register configured to latch a first input signal in response to an output clock signal, and thereby provide a first data signal;
a second output register configured to latch a second input signal in response to the output clock signal, and thereby provide a second data signal;
combinational logic configured to provide the first and second data signals in response to a first set of signals used to implement a first output function, the combinational logic further configured to provide a first test signal and a second test signal in response to a second set of signals used to implement a second output function, different than the first output function, wherein the combinational logic is included entirely within one or more pipes that lead into the first and second output registers;
a first multiplexer configured to route the first data signal or the first test signal as a first output signal in response to a mode signal;
a second multiplexer configured to route the second data signal or the second test signal as a second output signal in response to the mode signal; and
an output driver directly connected to receive the first and second output signal from the first and second multiplexers, and in response drive an output signal on an output terminal of the synchronous output buffer.

16. The synchronous output buffer of claim 15, wherein the output driver includes a first output circuit configured to selectively couple or de-couple a first voltage supply with the output terminal in response to the first output signal, and a second output circuit configured to selectively couple or dc-couple a second voltage supply with the output terminal in response to the second output signal.

17. The synchronous output buffer circuit of claim 16, wherein the first output circuit comprises a pull-up transistor controlled by the first output signal, and coupled between the output terminal and the first voltage supply, and wherein the second output circuit comprises a pull-down transistor controlled by the second output signal, and coupled between the output terminal and the second voltage supply.

18. The synchronous output buffer of claim 15, wherein the first output function comprises a data output enable function.

19. The synchronous output buffer of claim 18, wherein the second output function comprises a boundary scan output function.

20. The synchronous output buffer of claim 19, wherein the combinational logic includes logic configured to generate the mode signal in response to a first control signal that identifies a boundary scan mode and a normal operating mode, and a second control signal that identifies a tri-state condition in the boundary scan mode.

21. The synchronous output buffer circuit of claim 15, wherein the combinational logic includes one or more logic gates configured to generate the first and second input signals in response to a data signal and an output enable signal.

22. The synchronous output buffer circuit of claim 15, wherein the combinational logic includes one or more logic gates configured to generate the first and second test signals in response to a boundary scan data signal, a boundary scan output enable signal, and a boundary scan tri-state control signal.

23. The synchronous output buffer circuit of claim 15, wherein the output terminal is directly connected to an output connector of an integrated circuit chip.

24. The synchronous output buffer circuit of claim 15, wherein the first output register is substantially identical to the second output register, and the first multiplexer is substantially identical to the second multiplexer.

25. The synchronous output buffer circuit of claim 15, further comprising a connection that provides the second data signal from the second output register to a feedback path within the first output register, thereby preventing the output driver from simultaneously driving the output terminal to two different states.

26. The synchronous output buffer of claim 15, wherein the first and second output registers each comprise pass-through circuitry which, when enabled, allows the first and second input signals to be routed through the first and second output registers asynchronously.

27. The synchronous output buffer of claim 15, wherein the combinational logic includes a voltage translation circuit for translating one or more core voltages to one or more output voltages.

* * * * *